United States Patent
Hikichi

(10) Patent No.: US 9,726,714 B2
(45) Date of Patent: Aug. 8, 2017

(54) SENSOR DEVICE AND INSPECTION METHOD THEREOF

(71) Applicant: SII Semiconductor Corporation, Chiba-shi, Chiba (JP)

(72) Inventor: Tomoki Hikichi, Chiba (JP)

(73) Assignee: SII SEMICONDUCTOR CORPORATION, Chiba (JP)

(*) Notice: Subject to any disclaimer, the term of this patent is extended or adjusted under 35 U.S.C. 154(b) by 0 days.

(21) Appl. No.: 15/058,875

(22) Filed: Mar. 2, 2016

(65) Prior Publication Data
US 2016/0258995 A1  Sep. 8, 2016

(30) Foreign Application Priority Data
Mar. 6, 2015  (JP) .................. 2015-044972

(51) Int. Cl.
*G01R 31/10* (2006.01)
*G01R 31/28* (2006.01)

(52) U.S. Cl.
CPC ..... *G01R 31/2829* (2013.01); *G01R 31/2856* (2013.01); *G01R 31/2875* (2013.01); *H05B 2203/00* (2013.01); *H05B 2206/00* (2013.01); *H05B 2213/00* (2013.01)

(58) Field of Classification Search
CPC ............ H05B 2203/00; H05B 2206/00; H05B 2213/00; H05B 2214/00
See application file for complete search history.

(56) References Cited

U.S. PATENT DOCUMENTS

| | | | | |
|---|---|---|---|---|
| 3,724,955 A | * | 4/1973 | Takahashi | G03B 17/20 356/218 |
| 4,321,832 A | * | 3/1982 | Runyan | G01L 1/2281 702/138 |
| 4,607,162 A | * | 8/1986 | Sai | G01D 5/268 250/227.21 |
| 4,743,901 A | * | 5/1988 | Yamanoue | G07C 5/0825 340/500 |
| 2010/0308893 A1 | * | 12/2010 | Fukuoka | H03K 17/14 327/512 |
| 2013/0076350 A1 | * | 3/2013 | Muraoka | G01R 33/072 324/244 |
| 2014/0232455 A1 | * | 8/2014 | Teh | H02M 3/1588 327/541 |
| 2015/0194892 A1 | * | 7/2015 | Kudo | H02M 3/1588 323/271 |
| 2016/0084717 A1 | * | 3/2016 | Jeong | B60R 16/02 374/170 |

FOREIGN PATENT DOCUMENTS

JP    10-135286 A    5/1998

* cited by examiner

*Primary Examiner* — Jermele M Hollington
*Assistant Examiner* — Temilade Rhodes-Vivour
(74) *Attorney, Agent, or Firm* — Brinks Gilson & Lione

(57) ABSTRACT

To provide a sensor device which is capable of high temperature detection using self-heat generation without providing a dedicated terminal and suppresses an increase in cost with an increase in chip occupation area due to the addition of a test pad. A sensor device is configured to include an active logic switching circuit for switching an active logic of an output driver and perform a heating inspection while switching the active logic of the output driver during an inspection process with the output driver as a heat generation source.

4 Claims, 9 Drawing Sheets

SENSOR DEVICE AND INSPECTION METHOD THEREOF

This application claims priority under 35 U.S.C. §119 to Japanese Patent Application No. 2015-044972 filed on Mar. 6, 2015, the entire content of which is hereby incorporated by reference.

BACKGROUND OF THE INVENTION

Field of the Invention

The present invention relates to a sensor device which converts a physical quantity applied from outside into a binary voltage signal level, and an inspection method thereof, and relates to a sensor device capable of executing a high temperature inspection using self-heat generation without adding a test pad large in occupation area, and an inspection method thereof.

Background Art

In order to confirm that after manufacturing a semiconductor device, the function and property thereof satisfy product standards, the semiconductor device is inspected in a wafer state or a package state. It is desirable to perform even an inspection not only at normal temperature but also in a high temperature state in which a variation in property and a malfunction are commonly easy to occur. However, in order to raise an ambient temperature and thereby perform such a high temperature inspection, the introduction of a device and an additional inspection time are required, thus leading to an increase in cost.

In order to solve such a problem, attempts to raise a junction temperature of a chip at an ordinary temperature and thereby execute a high temperature inspection have heretofore been made.

FIG. 11 is a block diagram of a semiconductor device capable of high-temperature inspection by related art self-heat generation. The related art semiconductor device 1 has a power supply terminal 2, a ground terminal 3, an output terminal 4, a test terminal 100, and a resistive element 101 for heating connected to the test terminal 100. A voltage or current is supplied from the test terminal 100 to cause the resistive element 101 to generate heat, thereby enabling a high temperature inspection under the operation of the semiconductor device in a state in which the junction temperature of the chip is raised.

Further, FIG. 12 is a semiconductor device capable of high-temperature inspection by self-heat generation, which has been disclosed in Patent Document 1. The semiconductor device 1 has a power supply terminal 2, a ground terminal 3, an output terminal 4, a terminal 102 unused for measurement at the time of inspection, and parasitic PN junctions 103 and 104 such as ESD protection elements connected to the terminal 102. In this configuration, a forward current is supplied from the terminal 102 to the parasitic PN junction 103 or the parasitic PN junction 104 to thereby cause the parasitic PN junction to generate heat, whereby it is possible to perform a high temperature inspection under the operation of the semiconductor device in a state in which a junction temperature of a chip is raised.

Thus, the dedicated terminal, or the existing terminal unused for measurement at the time of inspection is used to cause the internal element to raise the junction temperature by the self-heat generation, whereby the high temperature inspection is carried out. Further, even in the case where an upper limit of an ambient temperature capable of being generated under a high temperature inspection environment is less than a desired temperature, an inspection at the desired temperature is made possible by setting the junction temperature higher than the ambient temperature, using the self-heat generation.

[Patent Document 1] Japanese Patent Application Laid-Open No. Hei 10 (1998)-135286

SUMMARY OF THE INVENTION

A related art semiconductor device, however, needs a dedicated terminal for supplying the voltage or current to a heat generating element or needs to supply the voltage or current to a parasitic PN junction of an ESD protection element connected to a terminal unused for measurement at the time of inspection.

A three-terminal sensor device typified by a magnetic switch is accompanied by problems that since it is not provided with terminals except for a power supply terminal, a ground terminal, and an output terminal, there is originally no terminal unused for measurement at the time of inspection, and that if an attempt is made to newly provide a test pad and a resistive element for heating within a chip, a chip area is increased and a cost demerit occurs.

Further, a three-terminal package has a problem in that it is not possible to provide a dedicated terminal for performing a heating test in a package state.

In order to solve the related art problems, a sensor device of the present invention is configured as follows:

The sensor device which switches an ON/OFF state of an output driver according to a physical quantity applied to a sensor element is configured to include an active logic switching circuit for switching an active logic of an output driver and perform a heating inspection while switching the active logic of the output driver during an inspection process with the output driver as a heat generation source.

According to the present invention, there can be provided a sensor device which includes an active logic switching circuit for switching an active logic of an output driver and is capable of high-temperature inspection using self-heat generation by using the output driver as a heating element without newly providing a dedicated terminal and the heating element and which suppresses an increase in cost with an increase in chip occupation area due to the addition of a test pad.

DETAILED DESCRIPTION OF THE PREFERRED EMBODIMENTS

A sensor device of the present invention will hereinafter be described with reference to the accompanying drawings.

Figure 1:
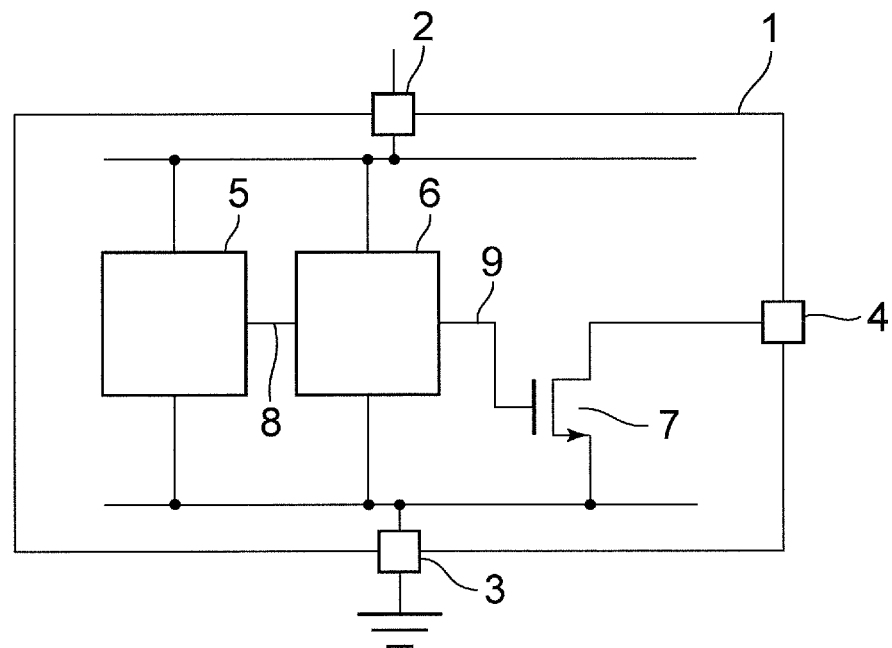
FIG. 1 is a block diagram of a sensor device of the present invention.

FIG. 1 is a block diagram illustrating the concept of the sensor device of the present invention. The sensor device switches an ON/OFF state of an output driver 7 according to a physical quantity applied to a sensor element.

The sensor device 1 of the present invention is equipped with a power supply terminal 2, a ground terminal 3, an output terminal 4, a sensor circuit 5, an active logic switching circuit 6, and the output driver 7.

In the present embodiment, the sensor device 1 will be described as an alternate detection type magnetic sensor circuit.

The sensor circuit 5 outputs a sensor output logic signal 8 according to the polarity and magnitude of an interlinking magnetic flux density inputted thereto. The active logic switching circuit 6 outputs a driver control signal 9 that positive or negative logic signal of the sensor output logic signal 8 according to the switching state of the active logic switching circuit 6. The output driver 7 is pulled up by a resistor through which a gate thereof is inputted with the driver control signal 9 and a drain thereof is connected to the output terminal 4. When the driver control signal 9 is "H", the output driver 7 is brought to an ON state and hence outputs "L" from the output terminal 4. When the driver control signal 9 is "L", the output driver 7 is brought to an OFF state and hence outputs "H" from the output terminal 4.

Figure 2:
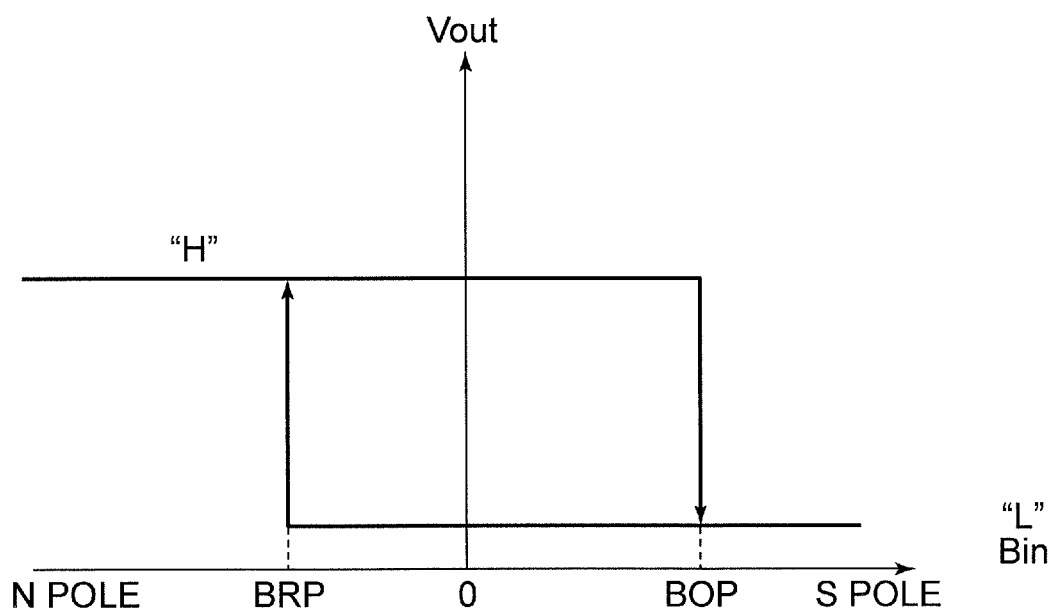
FIG. 2 is a diagram illustrating magnetoelectric conversion characteristics in a first state, which are related to the sensor device of the present invention.

FIG. 2 is a diagram illustrating magnetoelectric conversion characteristics in a first state of the sensor device of the present invention. Bin indicates a magnetic flux density to be applied, and Vout indicates an output voltage outputted when the output terminal 4 is pulled up outside a chip. The active logic switching circuit 6 is set to be an illustrated output logic in accordance with the magnetic flux density in the first state.

Figure 3:
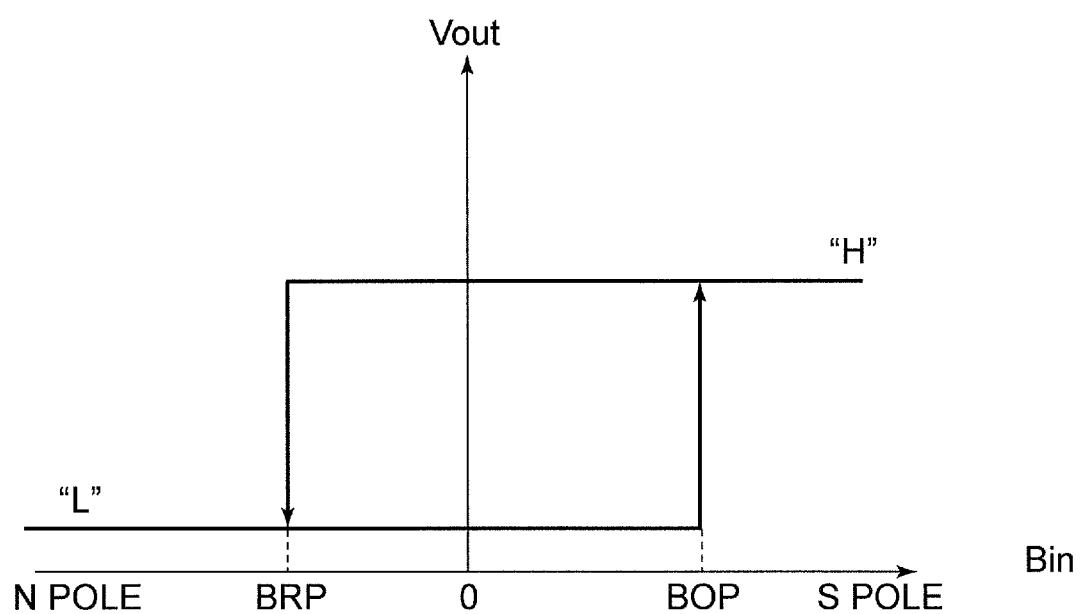
FIG. 3 is a diagram illustrating magnetoelectric conversion characteristics in a second state, which are related to the sensor device of the present invention.

FIG. 3 is a diagram illustrating magnetoelectric conversion characteristics in a second state of the sensor device of the present invention. The active logic switching circuit 6 is set in such a manner that an output logic is inverted compared with the first state in the second state.

Figure 4A:
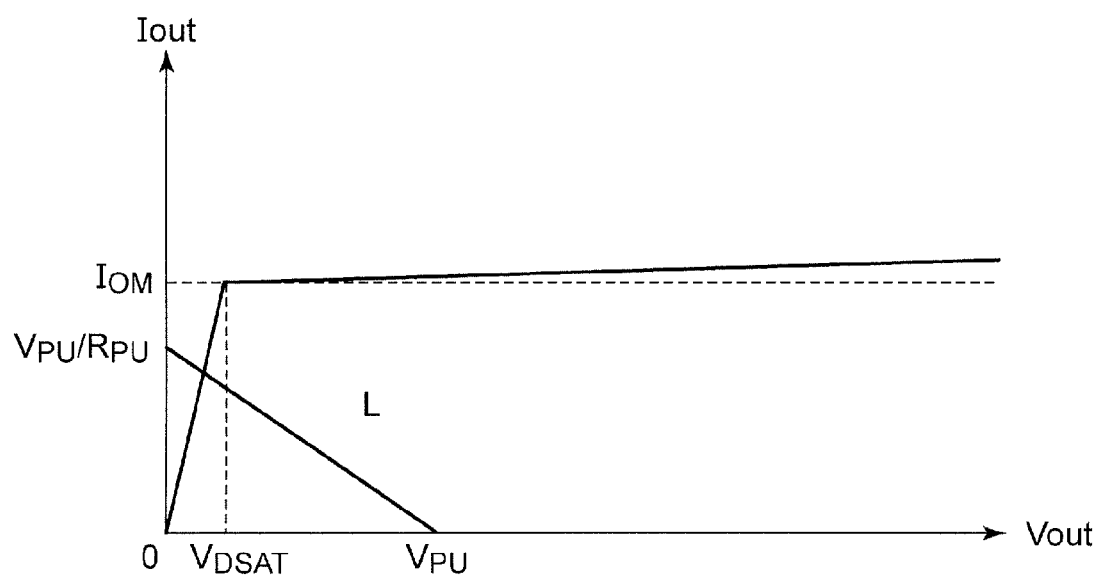
FIGS. 4A and 4B are diagrams illustrating output voltage dependence of an output driver current and power consumption, which is related to the sensor device of the present invention.
Figure 4B:
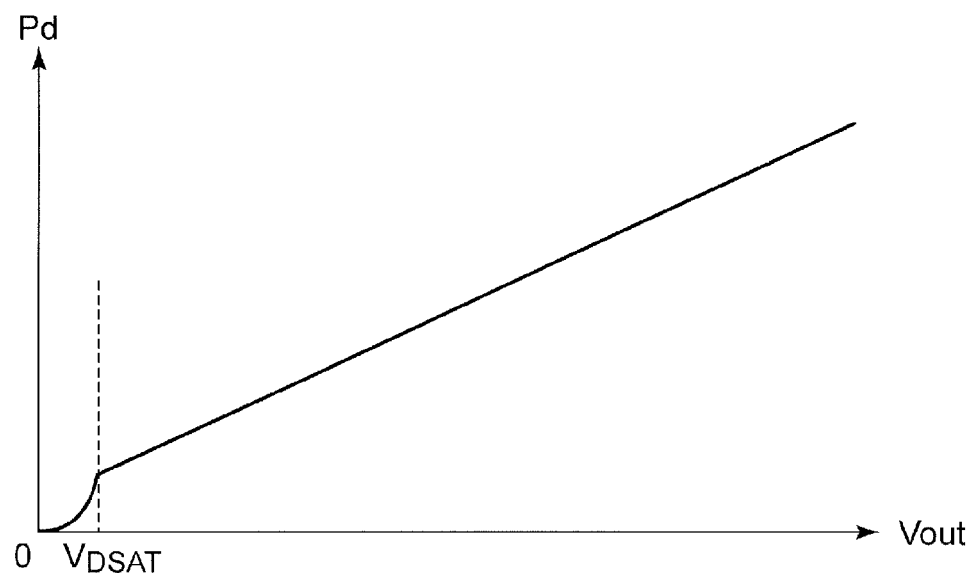

FIGS. 4A and 4B are diagrams illustrating output voltage dependence of an output current and power consumption in an ON state of the output driver. Since the output driver is used in a state of being current-limited by a pull-up voltage VPU and a pull-up resistor RPU both connected to the outside as indicated by a load line L when in normal use, the output voltage does not exceed a saturation voltage VDSAT. Thus, the output driver 7 performs a resistor region operation and acts as a resistor. On the other hand, when an output voltage is applied from outside upon inspection, and the applied output voltage exceeds the saturation voltage VDSAT, the output driver 7 enters a saturation region (constant current) operation to make a constant output current IOM determined by a W/L ratio of a transistor configuring the output driver 7 and a transconductance coefficient to flow. At this time, the power consumption (i.e., the amount of generated heat) of the output driver 7 becomes Pd=VOUT·IOM, and hence the amount of heat generated by the chip can be controlled according to the magnitude of the output voltage VOUT to be applied from outside.

Figure 5A:
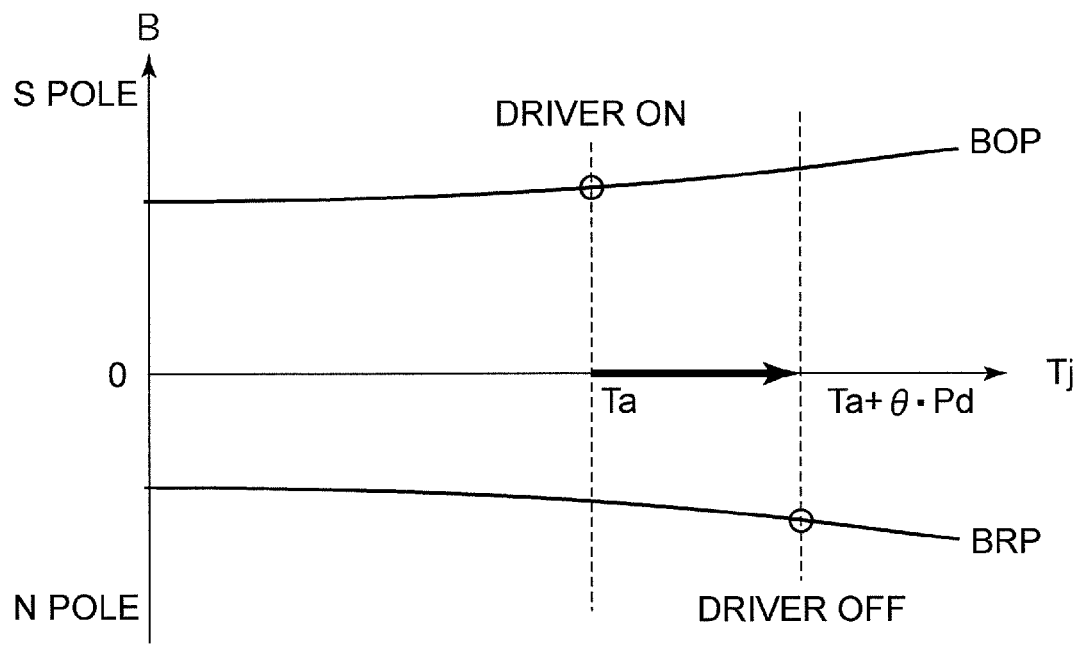
FIGS. 5A and 5B are diagrams illustrating temperature dependence of sensor characteristics, which is related to the sensor device of the present invention.
Figure 5B:
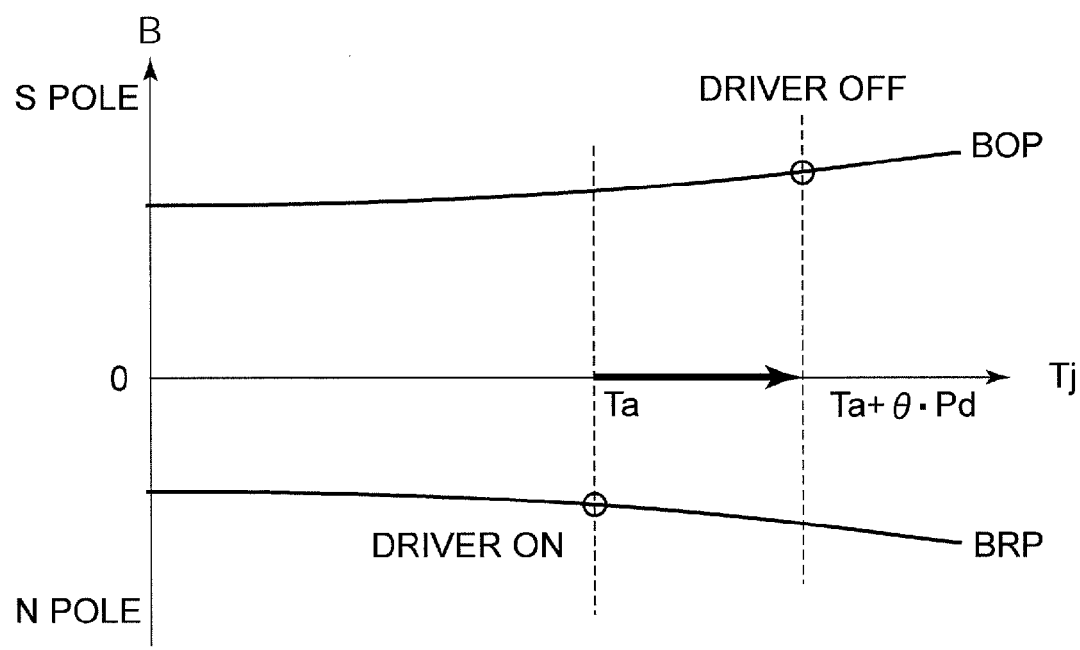

FIGS. 5A and 5B are diagrams illustrating temperature dependence of sensor characteristics, which is related to the sensor device of the present invention. FIG. 5A is the first state. When Bin<BOP, the output driver 7 is in an OFF state (equivalent to the output voltage "H"), and no current flows therein. Therefore, in the chip, a junction temperature Tj is approximately equal to an ambient temperature Ta because the output driver 7 is not self-heated. When an S-pole magnetic field is applied to reach Bin>BOP, the output driver 7 is turned ON (equivalent to the output voltage "L"). At this time, BOP at Tj=Ta is measured.

When the output driver 7 generates heat in an ON state, the chip is heated, so that the junction temperature Tj becomes Ta+θ·Pd after a time determined by a time constant expressed by the product of a thermal resistance and a thermal capacity depending on ambient environments. Here, θ indicates the thermal resistance which depends on the chip and the ambient environments, and Pd indicates power consumption of the output driver 7.

Next, when an N-pole magnetic field is applied to reach Bin<BRP, the output driver 7 is brought to the OFF state (equivalent to the output voltage "H"). At this time, BRP at Tj=Ta+θ·Pd is measured.

FIG. 5B is the second state. When Bin<BOP, the output driver 7 is in the ON state, and the chip is held at Tj=Ta+θ·Pd because the output driver 7 generates heat. When the S-pole magnetic field is applied to reach Bin>BOP, the output driver 7 is turned OFF (equivalent to the output voltage "H"). At this time, BOP at Tj=Ta+θ·Pd is measured. Since the output driver 7 does not generate heat in the driver OFF state, the chip is cooled in an ambient atmosphere, so that the junction temperature Tj becomes Ta after a time determined by a time constant expressed by the product of a thermal resistance and a thermal capacity depending on the chip and the ambient environments. Thereafter, when the N-pole magnetic field is applied to reach Bin<BRP, the output driver 7 is turned ON (equivalent to the output voltage "L"). At this time, BRP at Tj=Ta is measured.

Now assuming that Pd=VOUT·IOM and the equation of Tj is rearranged, VOUT is expressed as VOUT=(Tj−Ta)/(θ·IOM)=ΔT/(θ·IOM). Assuming that, for example, Tj=125° C., Ta=25° C., θ=0.2° C./mW, and IOM=50 mA, the output voltage VOUT is given like 10V. Also assuming that Tj=150° C., Ta=85° C., θ=0.2° C./mW, and IOM=50 mA, the output voltage VOUT is given like 6.5V. The output voltage VOUT is a rated voltage applicable to the output terminal 4, and hence the upper limit of temperature of the chip, which can be raised is rate-controlled.

As described above, the sensor magnetic properties BOP and BRP when the junction temperature Tj is at Ta and Ta+θ·Pd can be measured by sweeping the input magnetic flux density while switching the first state and the second state.

Figure 6:
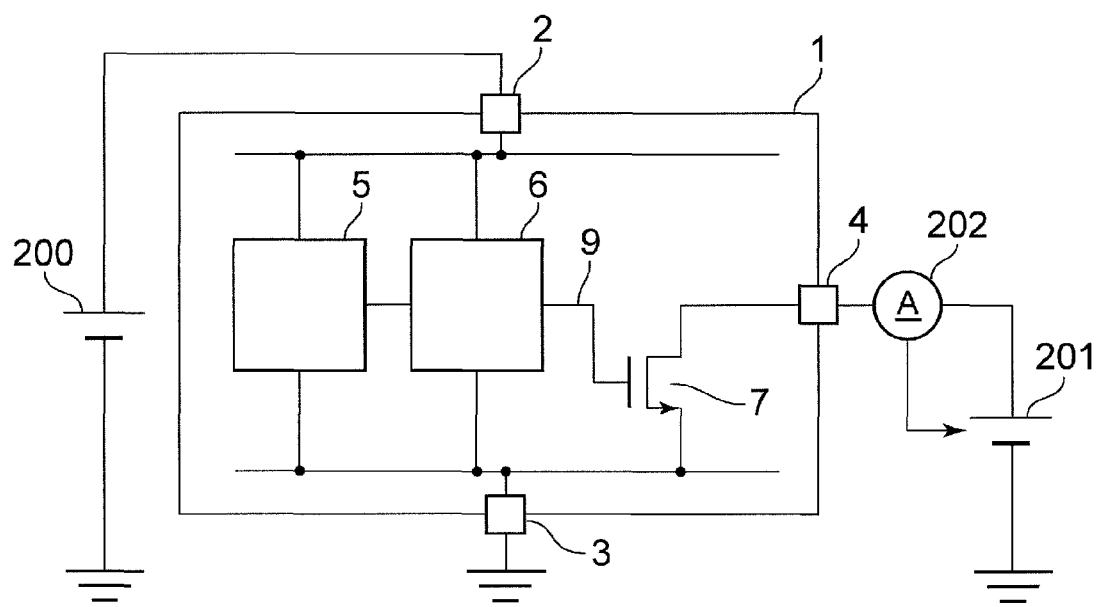
FIG. 6 is a diagram illustrating a measuring circuit at the time of inspection of the sensor device of the present invention.

FIG. 6 is a diagram illustrating a measuring circuit at the time of inspection of the sensor device of the present invention. A power supply 200 is connected to the power supply terminal 2. An output voltage power supply 201 and an ammeter 202 are connected to the output terminal 4. The power supply 200 supplies a power supply voltage for operation to the sensor device. The output voltage power supply 201 supplies a voltage for heating to the output driver 7. The ammeter 202 monitors a heating current to adjust an output voltage of the output voltage power supply 201. Monitoring whether current flows through the ammeter 202 or is cut off makes it possible to determine whether the input magnetic flux density Bin exceeds BOP or BRP.

Figure 7:
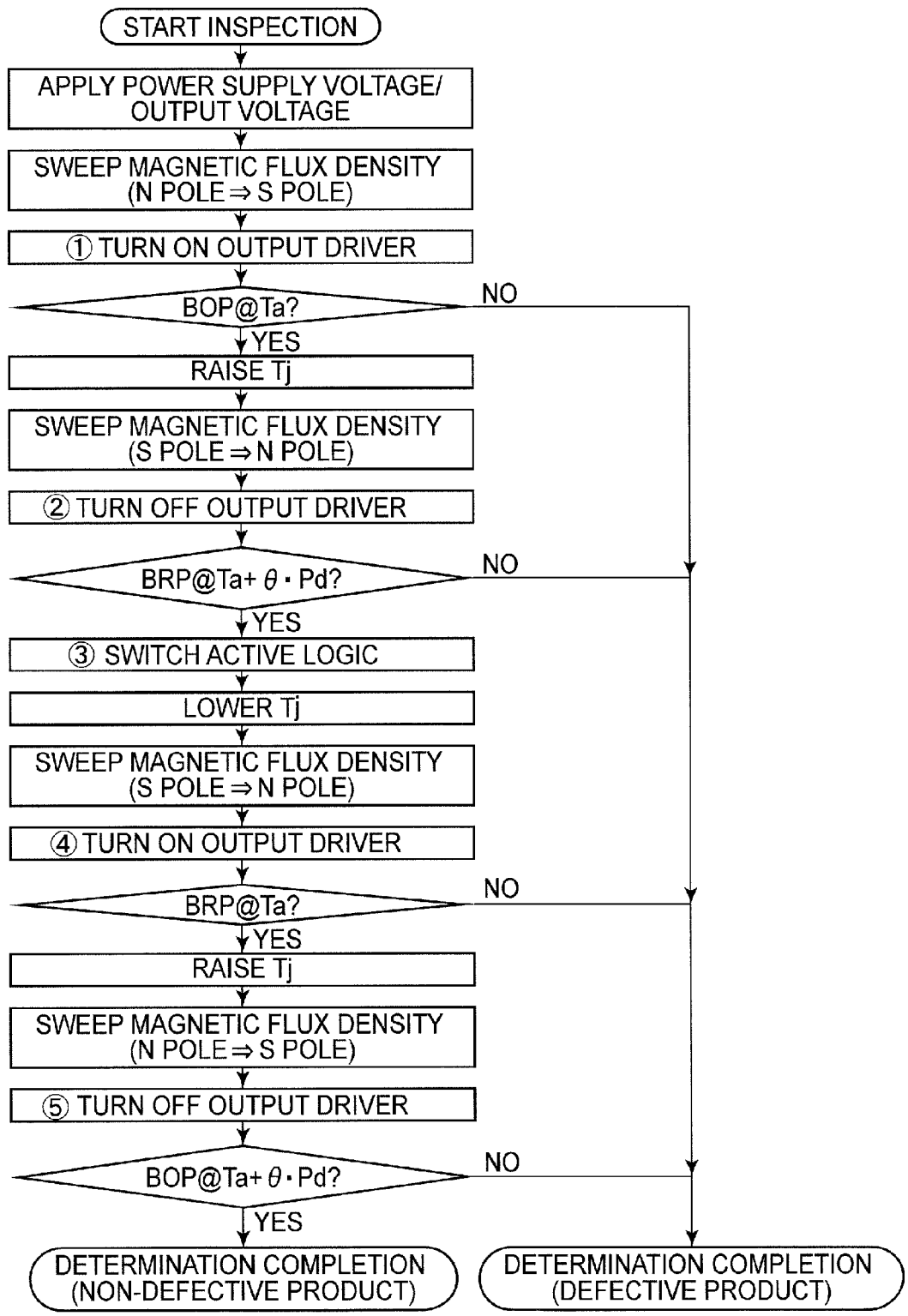
FIG. 7 is a flowchart illustrating one example of an inspection flow of the sensor device of the present invention.

FIG. 7 is a flowchart illustrating one example of an inspection flow of the sensor device of the present invention. The sensor magnetic properties BOP and BRP at the time that the junction temperature Tj is at Ta and Ta+θ·Pd can be measured by such an inspection flow. A circuit example of the sensor device for realizing this inspection flow will be described below using the drawing.

Figure 8:
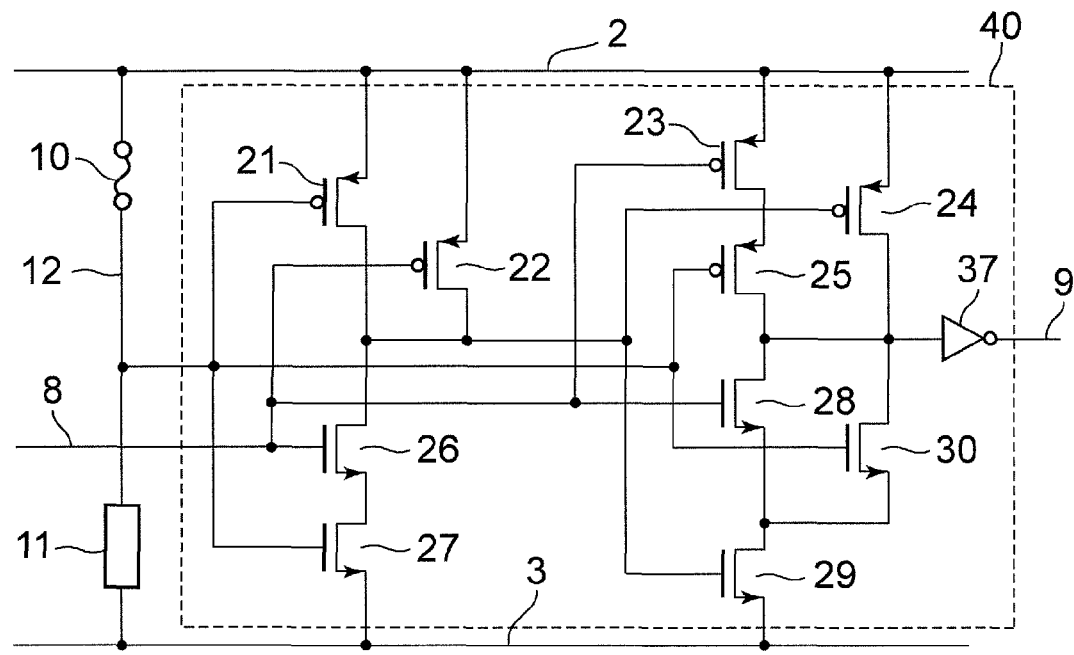
FIG. 8 is a circuit diagram illustrating one example of an active logic switching circuit of the sensor device of the present invention.

FIG. 8 is a circuit diagram illustrating one example of the active logic switching circuit 6 of the sensor device of the present invention.

The active logic switching circuit 6 illustrated in FIG. 8 has a laser trimming fuse 10, a pull-down element 11, transistors 21 to 30, and an inverter 37. The laser trimming fuse 10 and the pull-down element 11 are connected in series between a power supply terminal 2 and a ground terminal 3. A voltage at the mid-point therebetween is an active logic switching signal 12. The laser trimming fuse 10 can be melted by a laser trimming device in a wafer inspection process. When the resistance value of the pull-down element 11 is sufficiently larger than the resistance value of the laser trimming fuse 10, the active logic switching signal 12 becomes "H" in a state before the laser trimming fuse 10 is melted, and becomes "L" in a state after the laser trimming fuse 10 is melted.

Here, the transistors 21 to 30 and the inverter 37 configure an exclusive OR circuit 40. One of the inputs of the exclusive OR circuit 40 is connected to a sensor output logic signal 8, and the other thereof is connected to the active logic switching signal 12. The output of the exclusive OR circuit 40 is connected to a driver control signal 9. In the state before the laser trimming fuse 10 is melted, the driver control signal 9 is outputted as the positive logic (corresponding to the first state) of the sensor output logic signal 8. In the state after the laser trimming fuse 10 is melted, the driver control signal 9 is outputted as the negative logic (corresponding to the second state) of the sensor output logic signal 8.

Thus, the positive/negative of the driver control signal 9 can be switched before and after the laser trimming fuse 10 is melted by laser. By switching the active logic switching circuit 6 from the first state to the second state and switching the positive/negative of the driver control signal 9 as described above, the sensor properties BOP and BRP at the time that the junction temperature Tj is at Ta and Ta+θ·Pd can be measured.

Although the active logic switching circuit 6 illustrated in FIG. 8 is configured in such a manner that the laser trimming fuse 10 and the pull-down element 11 are respectively connected to the power supply terminal 2 side and the ground terminal 3 side to bring the active logic switching signal 12 to "H" before the melting and "L" after the melting, the active logic switching circuit 6 may be configured in such a manner that the laser trimming fuse 10 and the pull-down element 11 are respectively connected to the ground terminal 3 side and the power supply terminal 2 side to bring the active logic switching signal 12 to "L" before the melting and "H" after the melting.

Further, a depletion transistor having a gate terminal connected to the ground terminal 3 may be used instead of the pull-down element 11. It is obvious that the transistors 21 to 30 and the inverter 37 may respectively be realized by a minimum size transistor in a manufacturing process to be used because they are logic gates, and can be materialized with a mounting area far smaller than an occupation area (normally about 100 μm×100 μm) necessary for an additional test pad.

Figure 9:
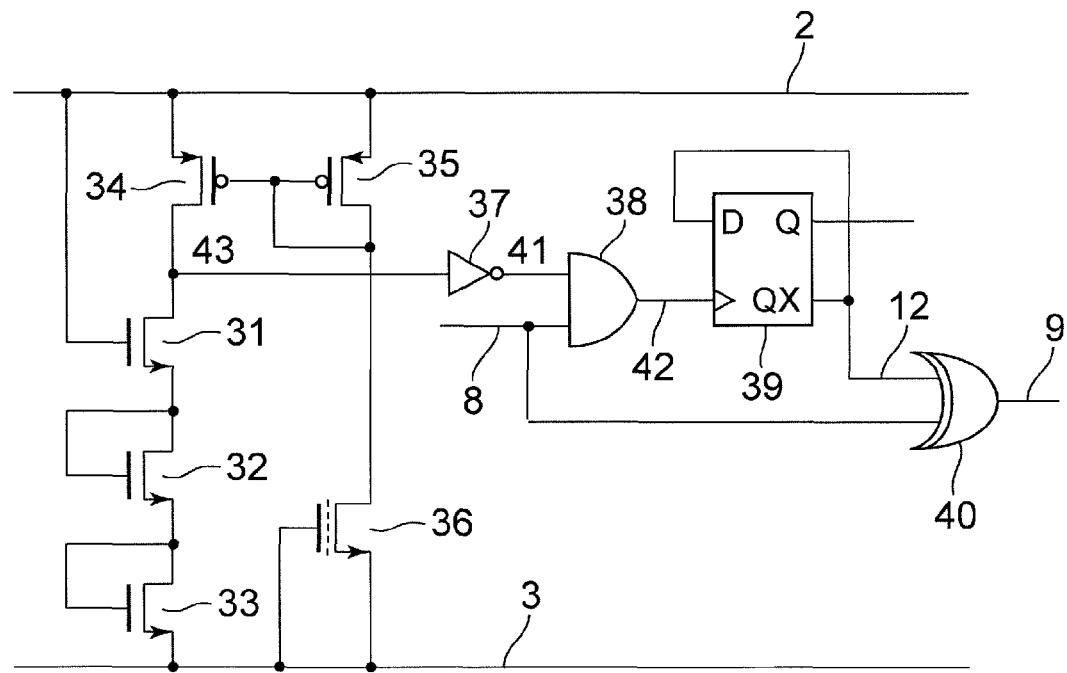
FIG. 9 is a circuit diagram illustrating another example of the active logic switching circuit of the sensor device of the present invention.

FIG. 9 is a circuit diagram illustrating another example of the active logic switching circuit 6 of the sensor device of the present invention.

The active logic switching circuit 6 illustrated in FIG. 9 has N-type enhancement transistors 31 to 33, P-type enhancement transistors 34 and 35, an N-type depletion transistor 36, an inverter 37, an AND gate 38, a D-type flip-flop 39, and an EXOR gate 40. Although not illustrated in the drawing, the D-type flip-flop 39 is provided with a reset terminal, and an initial internal state thereof after start-up of a power supply is held at "L".

Figure 10:
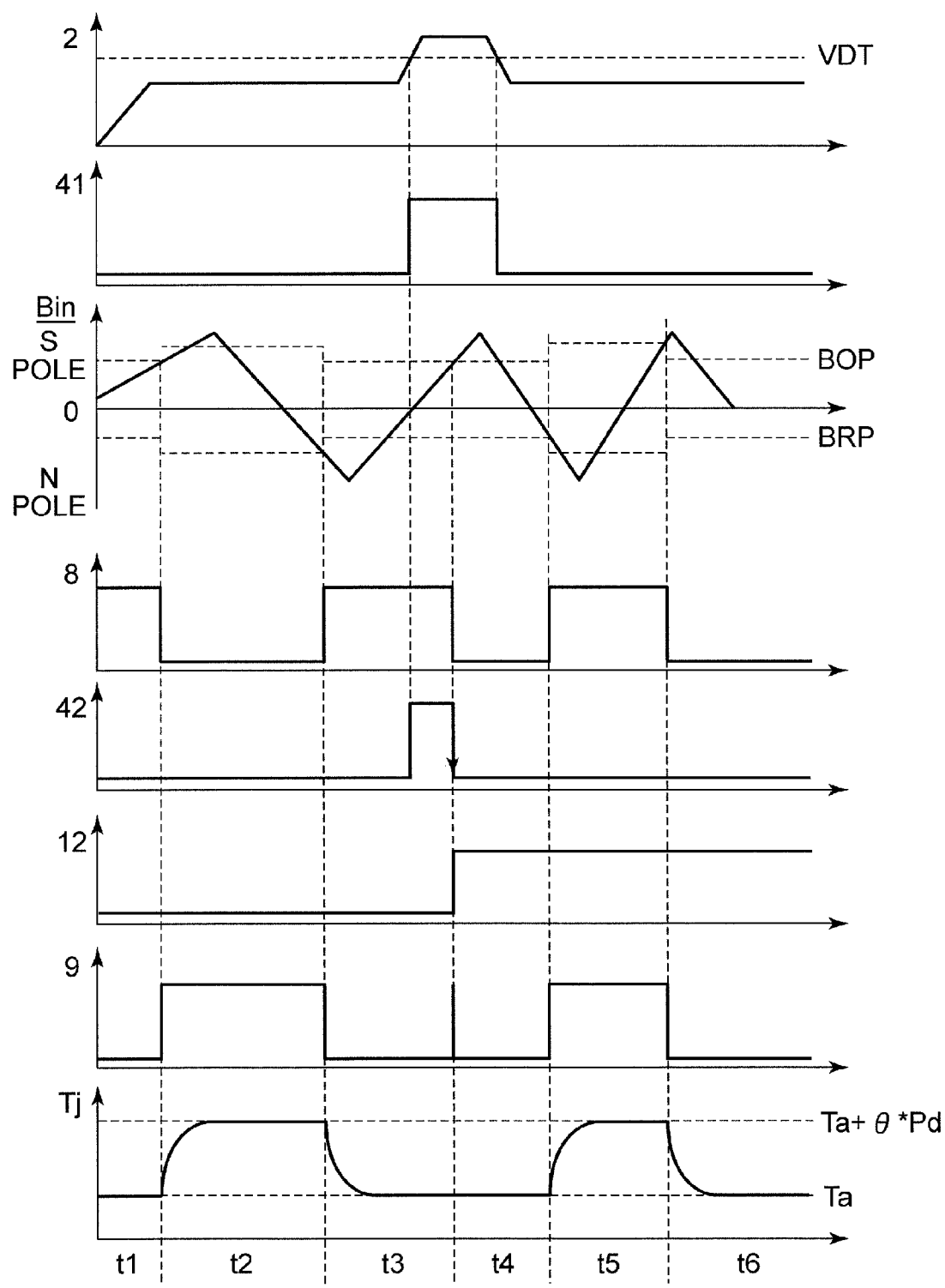
FIG. 10 is a timing chart illustrating the operation of the sensor device of the present invention.
Figure 11:
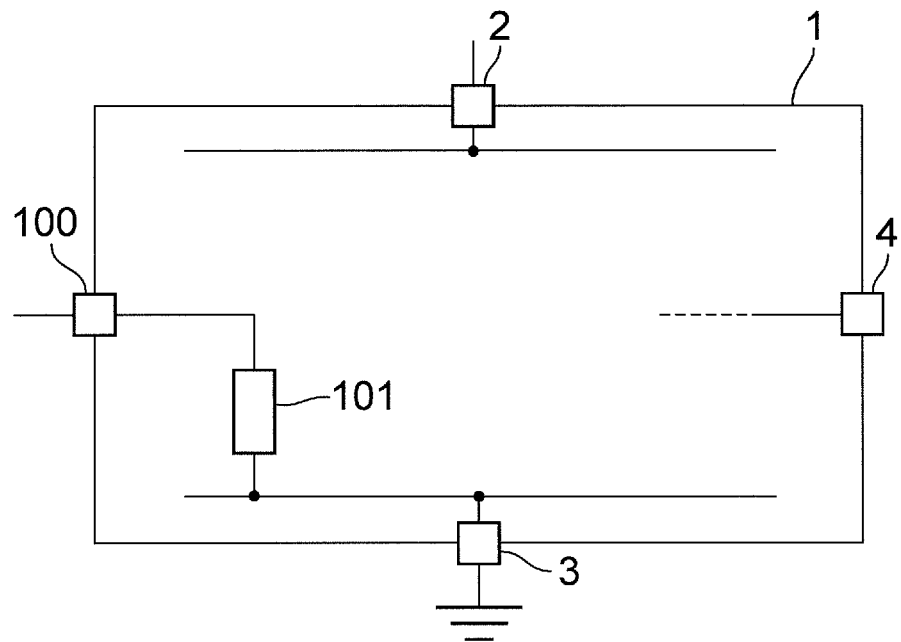
FIG. 11 is a block diagram illustrating one example of a semiconductor device capable of related art high-temperature inspection.
Figure 12:
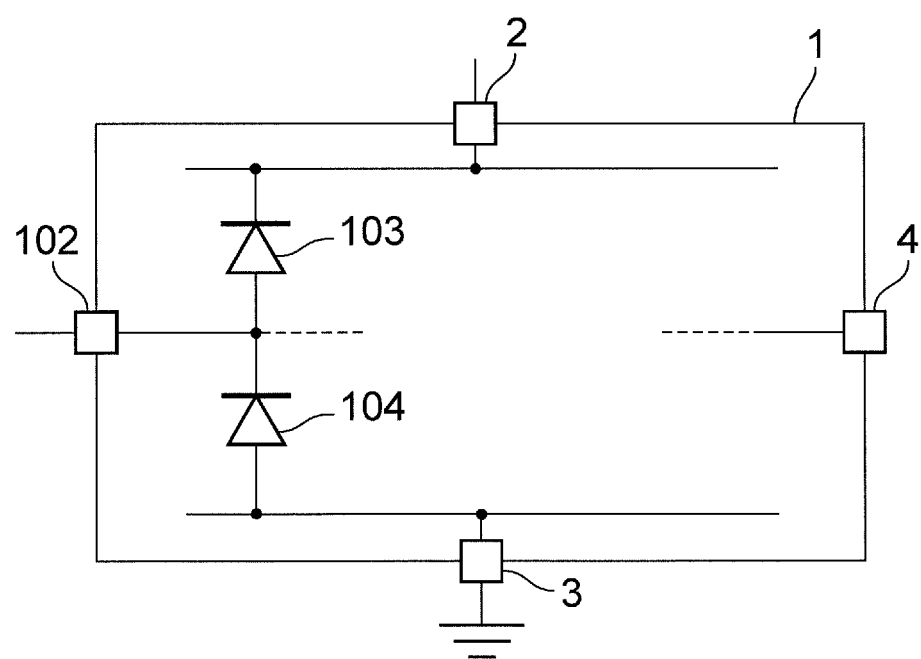
FIG. 12 is a block diagram illustrating another example of the semiconductor device capable of related art high-temperature inspection.

FIG. 10 is a timing chart illustrating the operation of the active logic switching circuit 6 illustrated in FIG. 9.

The N-type depletion transistor 36 has a gate connected to a ground terminal and is operated as a constant current source. The P-type enhancement transistors 34 and 35 are operated as a current mirror circuit and supplies a current obtained by multiplying a small constant current generated by the N-type depletion transistor 36 by a prescribed coefficient to the transistors 31 to 33. The transistors 31 to 33 are OFF when a gate voltage of the transistor 31 connected to the power supply terminal 2 is lower than 3·VTH.

Here, 3·VTH is set in such a manner that it becomes higher than the upper limit of a power supply voltage at which the sensor device is normally used, and becomes lower than the rated voltage of the transistor which configures the sensor device. At this time, an input signal 43 of the inverter 37 becomes "H", and a high voltage detection signal 41 which is an output signal of the inverter 37 is "L". A switching CLK signal 42 which is an output of the AND gate 38 is always "L" regardless of a sensor output logic signal 8. No CLK signal is inputted to a CLK terminal of the D-type flip-flop 39. An active logic switching signal 12 connected to one input of the EXOR gate 40 is "H". In this state, a driver control signal 9 which is an output of the EXOR gate 40 is outputted as a positive logic (corresponding to the first state) of the sensor output logic signal 8.

Next, when the gate voltage of the transistor 31 exceeds 3·VTH, the transistors 31 to 33 are turned ON so that the input signal 43 of the inverter 37 is brought to "L". At this time, the high voltage detection signal 41 becomes "H", and the switching CLK signal 42 becomes equal to the sensor output logic signal 8. Now, when the sensor output logic signal 8 is transitioned from "H" to "L" and the switching CLK signal 42 is transitioned from "H" to "L" by sweeping the applied magnetic flux density such that Bin>BOP is reached, a falling CLK signal is inputted to the CLK terminal of the D-type flip-flop 39.

At this time, the internal state of the D-type flip-flop 39 is switched from "L" (Q="L"/QX="H") to "H" (Q="H"/QX="L"), and the active logic switching signal 12 connected to one input of the EXOR gate 40 is switched from "H" to "L". In this state, the driver control signal 9 which is the output of the EXOR gate 40 is outputted as the negative logic (corresponding to the second state) of the sensor output logic signal 8.

Thus, the active logic of the output driver 7 can be switched by the voltage applied to the power supply terminal 2 and the applied magnetic flux density Bin. In order to restore the active logic switching circuit 6 from the second state to the original first state, the sensor output logic signal 8 may be transitioned from "H" to "L" by sweeping the magnetic field in such a manner that Bin>BOP is reached in the state in which the voltage of the power supply terminal 2 exceeds 3·VTH in like manner.

As described above, by switching the active logic switching circuit 6 from the first state to the second state and switching the positive/negative of the driver control signal 9, the sensor properties BOP and BRP at the time that the junction temperature Tj is at Ta and Ta+θ·Pd can be measured.

Although the circuit of FIG. 9 is configured in such a manner that the N-type enhancement transistors 31 to 33 are stacked in three stages, it may be configured as an arbitrary number of stages in terms of the range of a power supply voltage normally used in a sensor and the rated voltage of each transistor. A threshold value for high-voltage detection in the case where they are stacked vertically in n stages becomes n·VTH.

Also, although the N-type enhancement transistors are used, P-type enhancement transistors may be used.

Further, although the depletion transistor having the gate terminal connected to the ground terminal 3 is used as the constant current source, it may be possible to generate a small constant current, and another constant current circuit may be used.

Moreover, although the D-type flip-flop is used to hold the active logic switching state, a front/back gate configuration may suitably be changed using other flip-flops such as a T type and a JK type.

Thus, the sensor device can be provided which is provided with the power supply terminal 2, the ground terminal 3, the output terminal 4, the sensor circuit 5, the active logic switching circuit 6, and the output driver 7 and utilizes the output driver 7 as a heat generating element to thereby enable a high temperature inspection using self-heat generation without providing a dedicated terminal and suppress an increase in cost with the introduction of a new device, an increase in inspection time, and an increase in chip occupation area due to the addition of a test pad.

Although the active logic switching circuit using the laser trimming fuse, and the active logic switching circuit using the high-voltage detection circuit have been described in the embodiment in the specification, various switching circuits can be applied within the range not departing from the gist of the present invention.

Also, although the EXOR gate is used for the active logic switching circuit in the embodiment, a selector circuit based on a plurality of parallel transmission gates may be used.

Further, although the sensor circuit 5 has been described as the alternate detection type magnetic switch in the embodiment in the specification, the sensor circuit 5 may be other binary-output magnetic sensors, e.g., a monopolar detection type magnetic switch, and a bipolar detection type magnetic switch or may be applied to other binary-output physical quantity sensors, e.g., a current switch, an acceleration switch, and an illuminance switch.

Although the preferred embodiment of the invention has been described in the present specification, the above description is a mere illustration of the principle of the present invention. Accordingly, various changes can be made by a person skilled in the art without departing from the scope and gist of the present invention.

What is claimed is:

1. A sensor device comprising a semiconductor device having three terminals including a power supply terminal, a ground terminal, and an output terminal configured to switch an ON/OFF state of an output driver according to a physical quantity applied to a sensor element, the sensor device further comprising:
    a sensor circuit configured to output a binary sensor output logic signal according to a magnitude of the physical quantity; and
    an active logic switching circuit configured to receive the binary sensor output logic signal and to execute switching control of the ON/OFF state of the output driver
    wherein the active logic switching circuit is further configured to switch the logic of the binary sensor output logic signal according to an active logic switching signal generated therein, the active logic switching circuit including an exclusive OR circuit configured to receive the binary sensor output logic signal and the active logic switching signal and output a driver control signal to the output driver.

2. The sensor device according to claim 1, wherein the active logic switching circuit further comprises:
    a high voltage detection circuit configured to switch and output the active logic switching signal according to a voltage at the power supply terminal, and
    the logic circuit having a flip-flop circuit configured to hold the active logic switching signal from the high voltage detection circuit, in accordance with a transition of the binary sensor output logic signal.

3. A method for inspecting the sensor device according to claim 2, comprising the steps of:
    applying a first voltage to the power supply terminal, applying a second voltage to the output terminal, and thereby setting the sensor device to a first state;
    increasing the physical quantity in the first state and detecting the physical quantity to thereby measure the physical quantity when the output of the output driver is inverted;
    decreasing the physical quantity in the first state and avoiding detection in the physical quantity to thereby measure the physical quantity when the output of the output driver is inverted;
    applying a third voltage higher than the first voltage to the power supply terminal and thereby setting the sensor device to a second state;
    increasing the physical quantity in the second state and detecting the physical quantity to thereby measure the physical quantity when the output of the output driver is inverted; and
    decreasing the physical quantity in the second state and avoiding detection in the physical quantity to thereby measure the physical quantity when the output of the output driver is inverted.

4. A method for inspecting a sensor device comprising:
    providing a sensor device comprising a semiconductor device having three terminals including a power supply terminal, a ground terminal, and an output terminal configured to switch an ON/OFF state of an output driver according to a physical quantity applied to a sensor element, the sensor device further comprising:
    a sensor circuit configured to output a binary sensor output logic signal according to a magnitude of the physical quantity; and
    an active logic switching circuit configured to receive the binary sensor output logic signal and to execute switching control of the ON/OFF state of the output driver, wherein the active logic switching circuit is further configured to switch the logic of the binary sensor output logic signal according to an active logic switching signal generated therein;

the method further comprising applying a first voltage to the power supply terminal, applying a second voltage to the output terminal, and thereby setting the sensor device to a first state;

increasing the physical quantity in the first state and detecting the physical quantity to thereby measure the physical quantity when the output of the output driver is inverted;

decreasing the physical quantity in the first state and avoiding detection in the physical quantity to thereby measure the physical quantity when the output of the output driver is inverted;

applying a third voltage higher than the first voltage to the power supply terminal and thereby setting the sensor device to a second state;

increasing the physical quantity in the second state and detecting the physical quantity to thereby measure the physical quantity when the output of the output driver is inverted; and decreasing the physical quantity in the second state and avoiding detection in the physical quantity to thereby measure the physical quantity when the output of the output driver is inverted.

* * * * *